United States Patent
Chen et al.

(10) Patent No.: US 9,904,479 B1
(45) Date of Patent: Feb. 27, 2018

(54) METHOD FOR EXTENDING PERIOD OF DATA RETENTION OF FLASH MEMORY DEVICE AND DEVICE FOR THE SAME

(71) Applicant: Innodisk Corporation, New Taipei (TW)

(72) Inventors: Ming-Sheng Chen, New Taipei (TW); Ting-Chiang Liu, New Taipei (TW); Liang-Tsung Wang, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 0 days.

(21) Appl. No.: 15/427,991

(22) Filed: Feb. 8, 2017

(30) Foreign Application Priority Data

Nov. 10, 2016 (TW) .............. 105136652 A

(51) Int. Cl.
  *G06F 3/06* (2006.01)
  *G11C 16/34* (2006.01)
  *G11C 16/16* (2006.01)

(52) U.S. Cl.
  CPC .......... *G06F 3/0616* (2013.01); *G06F 3/065* (2013.01); *G06F 3/0652* (2013.01); *G06F 3/0679* (2013.01); *G11C 16/16* (2013.01); *G11C 16/3431* (2013.01); *G11C 16/3495* (2013.01)

(58) Field of Classification Search
  CPC ............ G11C 16/3418; G11C 16/3495; G11C 11/40626
  See application file for complete search history.

(56) References Cited

U.S. PATENT DOCUMENTS

| | | | | |
|---|---|---|---|---|
| 8,645,770 B2 * | 2/2014 | Fai | .............. | G06F 11/1068 714/704 |
| 8,982,653 B2 * | 3/2015 | Nurminen | .............. | G11C 7/04 365/211 |
| 9,165,668 B1 * | 10/2015 | Zhao | | |
| 9,595,347 B2 * | 3/2017 | Zhao | .............. | G11C 16/3418 |
| 2014/0101371 A1 * | 4/2014 | Nguyen | .............. | G06F 3/0616 711/103 |
| 2015/0153962 A1 | 6/2015 | Salessi et al. | | |

FOREIGN PATENT DOCUMENTS

TW    I490869 B    7/2015

* cited by examiner

*Primary Examiner* — Vanthu Nguyen
(74) *Attorney, Agent, or Firm* — Chun-Ming Shih

(57) ABSTRACT

A method for extending period of data retention of a flash memory device and a device for the same are disclosed. In the present invention, the temperature of the flash memory device is detected by a temperature sensor. According to the temperature and P/E cycles of the flash memory device, a safe period is obtained for the data retention of the flash memory device. By refreshing each block of the flash memory device during the safe period, the data retention period is refreshed, and the data stored in the flash memory device can be prevented from bit error caused by exceeding data retention period or read disturb.

10 Claims, 5 Drawing Sheets

METHOD FOR EXTENDING PERIOD OF DATA RETENTION OF FLASH MEMORY DEVICE AND DEVICE FOR THE SAME

FIELD OF THE INVENTION

The present invention is related to a method for data retention of a flash memory device and a device for the same, more particularly to a method for extending the period of data retention of a flash memory device and a device for the same.

BACKGROUND OF THE INVENTION

Flash memory is an electronic non-volatile computer storage medium that can be electrically erased and reprogrammed. Once data have been written into the flash memory, they will be kept for a period of time even if the electric power is removed. A flash memory device has advantages of: small size, large storage volume, fast read/write speed, less power consumption, quiet and less prone to mechanical failure. It is widely used in embedded systems, portable information devices and consumer electronics.

Since flash memory device has the aforementioned advantages, data storage devices for temporarily data storing on the market, such as memory cards and USB drives, are all flash memory devices. Furthermore, some data storage devices for long-term data storing, such as hard disk drives, are also flash memory devices (solid state disk, SSD).

However, flash memory cells have a limited number of write and erase cycles, limited period of data retention, read disturb and write disturb.

The period of data retention is closely related to program/erase (P/E) cycles. The period of data retention will be shortened greatly after the P/E cycles exceed a predetermined number. Once data have been stored in a flash memory device longer than the period of data retention of the flash memory device, even if there is no read or write process been performed, bit error may occur.

Consequently, how to extend the period of data retention of a flash memory to prevent the data stored in the flash memory from error is the problem of the community.

SUMMARY OF THE PRESENT INVENTION

It is an objective of the present invention to provide a method for data retention of a flash memory device and a device for the same, more particularly a method for extending the period of data retention of a flash memory device and a device for the same.

It is another objective of the present invention to provide a method for extending the period of data retention of a flash memory device, which determines a safe period according to the temperature and P/E cycles of the flash memory device and refreshes each memory block of the flash memory device during the safe period to refresh the period of data retention of the flash memory device.

It is still another objective of the present invention to provide a flash memory device for extending the period of data retention, which comprises a sensor to determine the temperature of the flash memory device; and a refresh unit configured to calculate a safe period and refresh each memory block during the safe period to refresh the period of data retention of the flash memory device.

The present invention provides a method for extending the period of data retention of a flash memory device, wherein the flash memory device comprises a flash memory with a plurality of memory blocks, wherein a portion of the plurality of memory blocks are configured to be a data storage region, wherein the method comprises: obtaining a temperature and a number of program/erase (P/E) cycles of the flash memory device; determining a safe period according to the temperature and the number of P/E cycles; and refreshing all the memory blocks of the data storage region during the safe period.

In one embodiment of the present invention, the step of refreshing all the memory blocks of the data storage region during the safe period comprises: copying data of at least one memory block of the data storage region; erasing the at least one memory block; and rewriting the data into the at least one memory block.

In one embodiment of the present invention, the other portion of the plurality of memory blocks are configured to be a reserve region.

In one embodiment of the present invention, the method further comprises: obtaining a number of the memory blocks of the data storage region; dividing the safe period into a plurality of block periods according to the number of the memory blocks of the data storage region; and refreshing each memory block of the data storage region during the block period.

In one embodiment of the present invention, the safe period is equal to a period of data retention of the flash memory corresponding to the temperature and the number of P/E cycles multiplied by a predetermined rate.

In one embodiment of the present invention, the predetermined rate is greater than 0 and smaller than 1.

In one embodiment of the present invention, the step of refreshing the memory blocks of the data storage region is performed when the flash memory device is in an idle state.

The present invention further provides a flash memory device for extending a period of data retention comprising: a flash memory having a plurality of memory blocks, wherein a portion of the plurality of memory blocks are configured to be a data storage region; a controller connected to the flash memory for controlling data access of the flash memory, wherein the controller has a refresh unit; and a sensor connected to the controller for detecting a temperature of the flash memory device; wherein the refresh unit comprises: a temperature fetching module configured to obtain the temperature detected by the sensor; a program/erase (P/E) cycles fetching module configured to obtain a number of P/E cycles of the flash memory; a period determining module configured to determine a safe period according to the temperature and the number of P/E cycles; and a refresh module configured to refresh all the memory blocks of the data storage region during the safe period.

In one embodiment of the present invention, the other portion of the plurality of memory blocks of the flash memory is configured to be a reserve region; wherein the refresh module refreshes the memory blocks by copying data of at least one memory block of the data storage region to the reserve region, erasing the at least one memory block and rewriting the data into the at least one memory block.

In one embodiment of the present invention, the period determining module further divides the safe period into a plurality of block periods; wherein the refresh module refreshes each memory block of the data storage region during the block period.

In one embodiment of the present invention, the refresh unit further comprises a property module for storing properties of the flash memory.

In one embodiment of the present invention, the refresh unit is embodied by hardware, software or firmware.

DETAILED DESCRIPTION OF THE PREFERRED EMBODIMENTS

Figure 1:
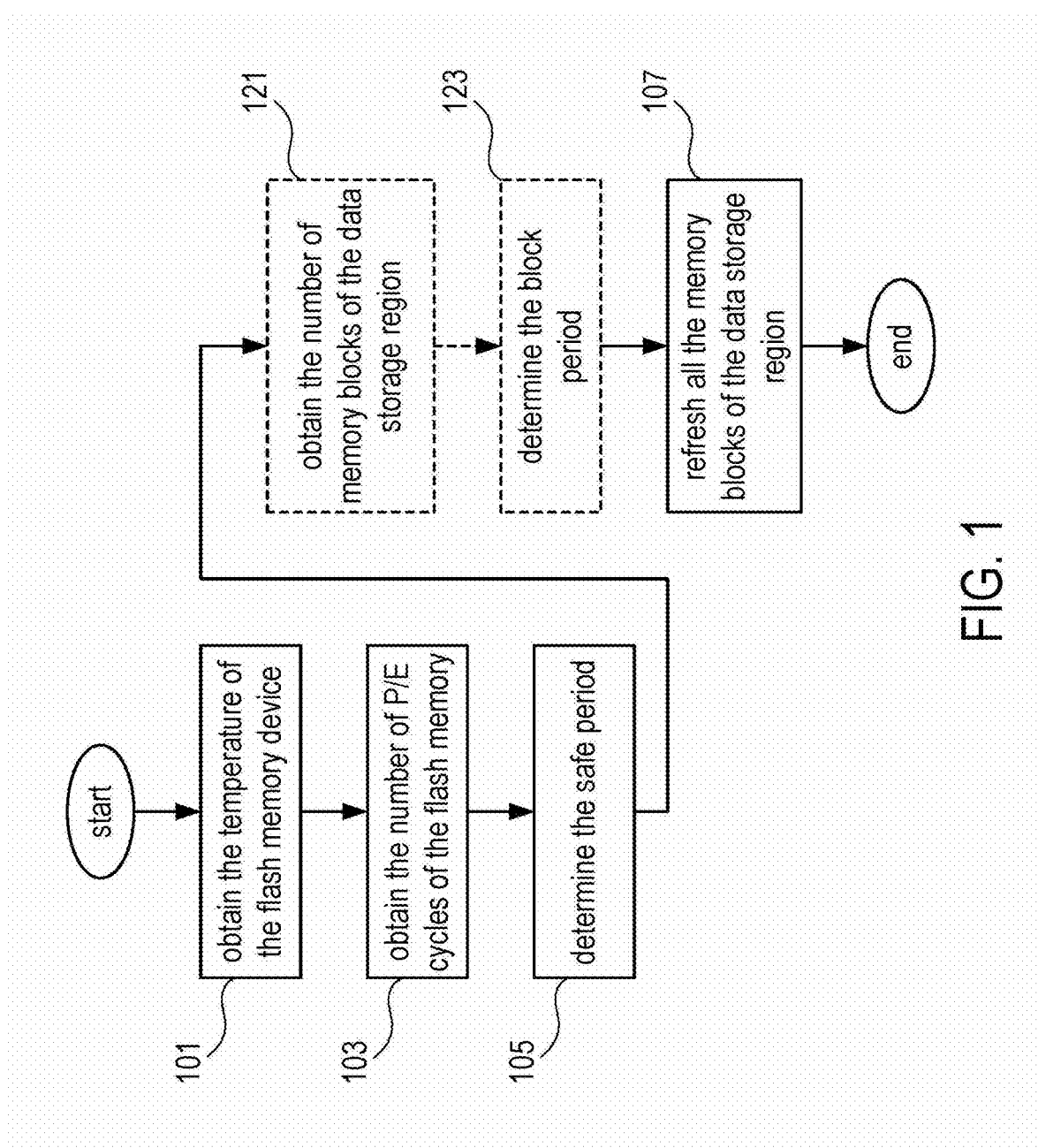
FIG. 1 is a flowchart showing the method for extending the period of data retention of a flash memory device in accordance with one embodiment of the present invention.

Referring to FIG. 1, there is shown a flowchart of a method for extending the period of data retention of a flash memory device in accordance with one embodiment of the present invention. The flash memory device comprises a flash memory. The flash memory has a plurality of memory blocks, and a portion of the plurality of memory blocks are configured to be a data storage region. In the method of the present invention, the temperature and the number of program/erase (P/E) cycles of the flash memory device are firstly obtained, as shown in steps 101 and 103. The number of P/E cycles can be obtained from the controller of the flash memory device. And then, a safe period for data retention of the flash memory device is determined according to the temperature and the number of P/E cycles, and all memory blocks of the data storage region should be refreshed during the safe period, as shown in steps 105 and 107. By refreshing all the memory blocks of the data storage region during the safe period, the period of data retention of the flash memory device is refreshed. Consequently, data stored in the flash memory device are prevented from bit error caused by exceeding data retention period.

Figure 5:
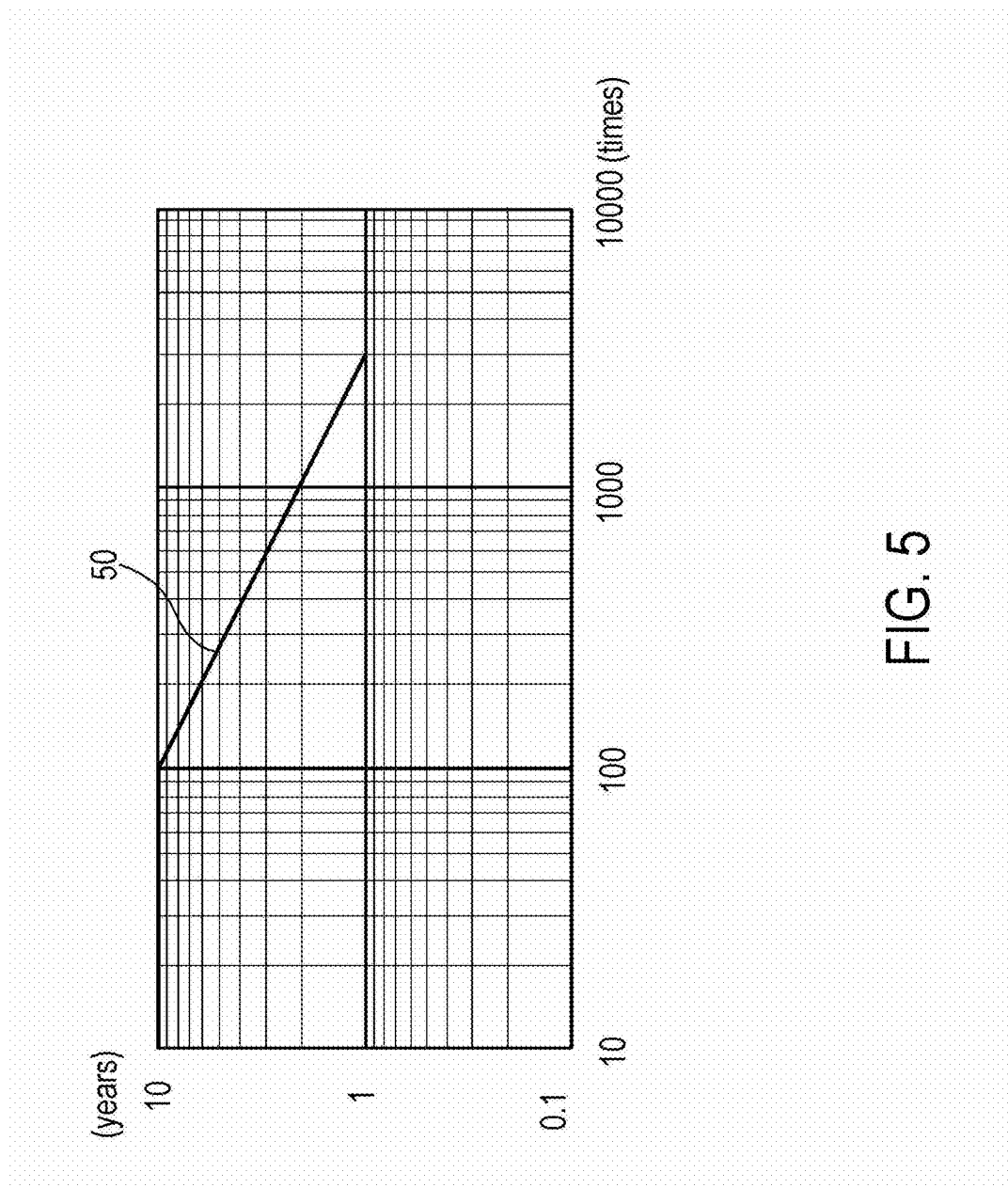
FIG. 5 is a schematic diagram showing the relationship between the data retention and P/E cycles in accordance with one embodiment of the present invention.

The safe period is determined according to the properties described in the specification of the flash memory, such as the relationship between data retention and P/E cycles (as shown in FIG. 5) and the acceleration effect of the temperature. By firstly calculating the period of data retention under normal temperature (40° C.) according to the data retention 50 of FIG. 5, and then calculating the acceleration effect of temperature, the period of data retention at the temperature is obtained.

In one embodiment of the present invention, the acceleration effect of temperature is calculated according to the following equation:

$$AF = e^{-(Ea/R(1/T2 - 1/T1))} \quad (eq1)$$

Wherein, AF is the acceleration factor; R is the Boltzmann constant; Ea is the activation energy which is related to the type and manufacturing process of the flash memory; T is the Kelvin temperature of the flash memory device; and T1 is the normal temperature (40° C.=313.15 K).

In one embodiment of the present invention, a predetermined rate is used for safety. Once the period of data retention at the temperature is obtained, the safe period is determined by multiplying the period of data retention by the predetermined rate. In one embodiment of the present invention, the predetermined rate is greater than 0 and smaller than 1.

Figure 2:
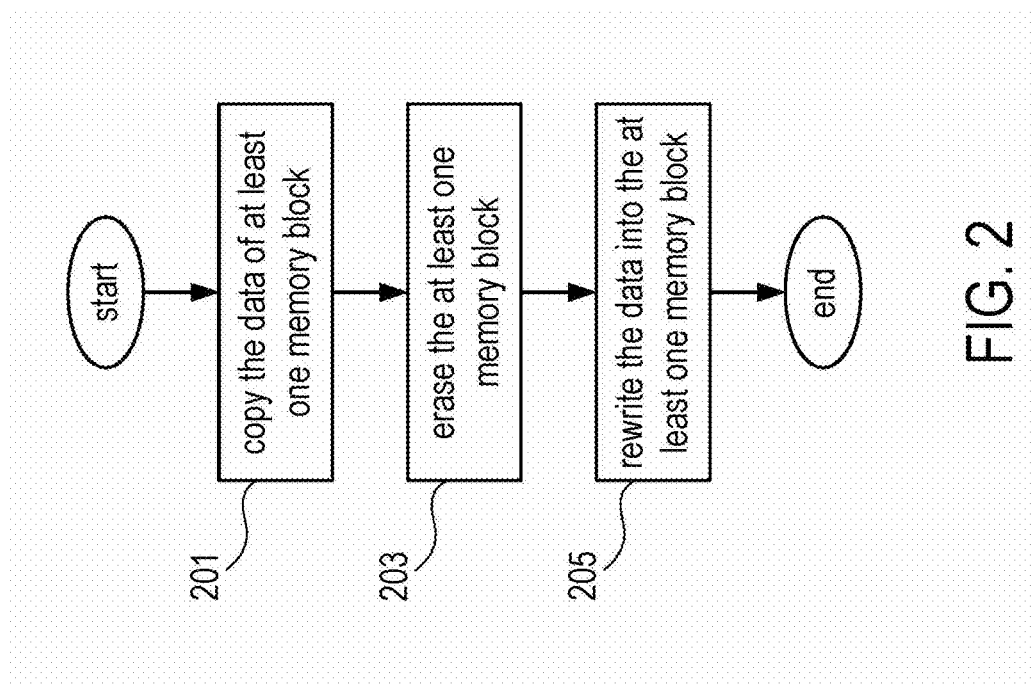
FIG. 2 is a flowchart showing the method for refreshing the memory blocks of the flash memory device in accordance with one embodiment of the present invention.

Referring to FIG. 2, there is shown a flowchart of a method for refreshing the memory blocks of the flash memory in accordance with one embodiment of the present invention. In the present invention, the method for refreshing the memory blocks of the flash memory comprises steps of: copying the data of at least one memory block of the data storage region; erasing the at least one memory block; and rewriting the data into the at least one memory block, as shown in steps 201-205.

In one embodiment of the present invention, the other portion of the plurality of memory blocks are configured to be a reserve region. In one embodiment of the present invention, the data of the at least one memory block of the data storage region is copied to the reserve region in step 201.

Referring to FIG. 1 again, the method for extending the period of data retention of a flash memory device further comprises steps of: obtaining the number of memory blocks of the data storage region, as shown in step 121; and dividing the safe period into a plurality of block periods according to the number of memory blocks of the data storage region, as show in step 123. In one embodiment of the present invention, the step 107 of refreshing all the memory blocks of the data storage region is performed by refreshing each memory block of the data storage region during the block period in order.

In one embodiment of the present invention, the step of refreshing all the memory blocks of the data storage region is performed when the flash memory device is in an idle state.

Figure 3:
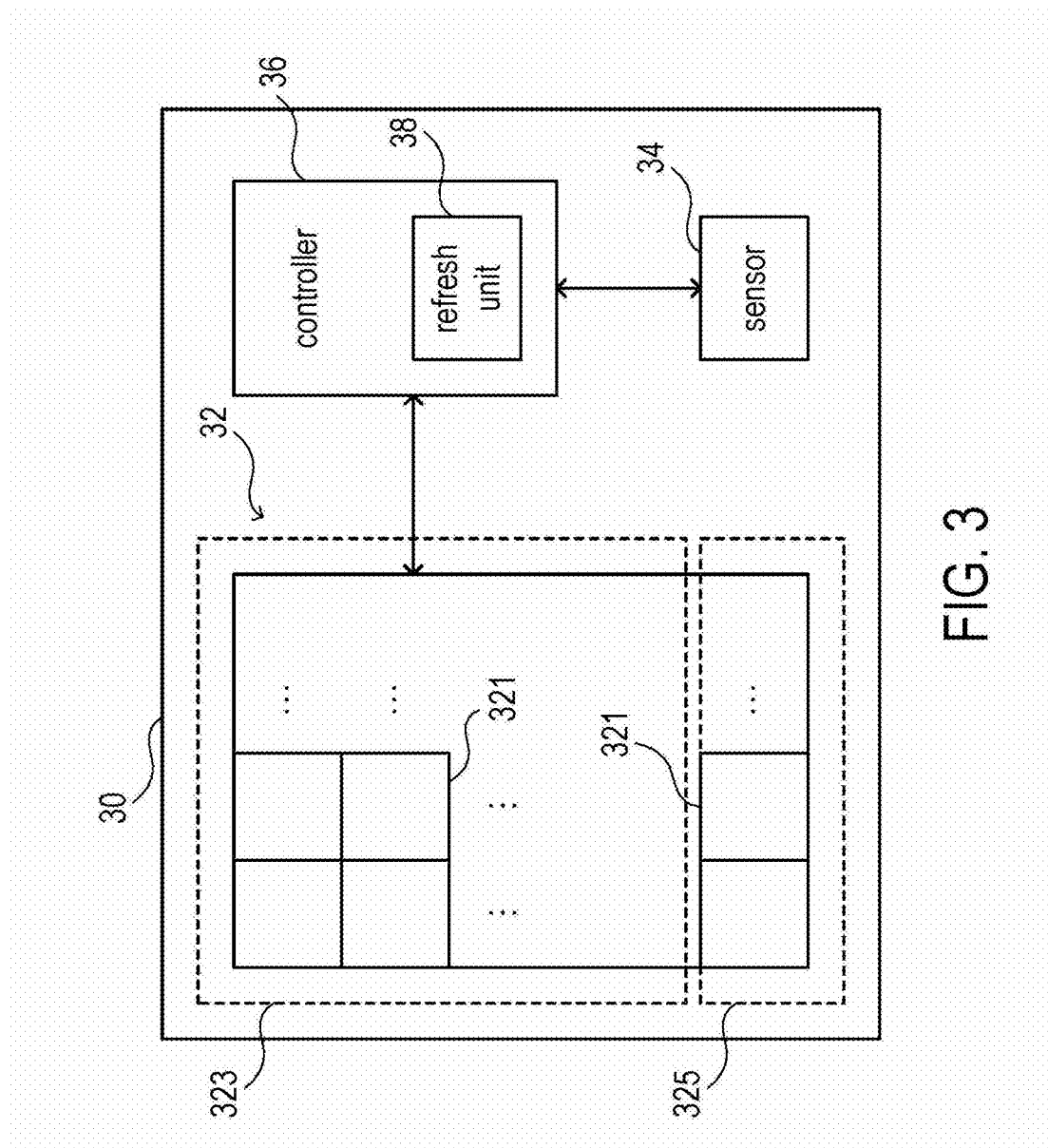
FIG. 3 is a schematic diagram showing a flash memory device for extending the period of data retention in accordance with one embodiment of the present invention.
Figure 4:
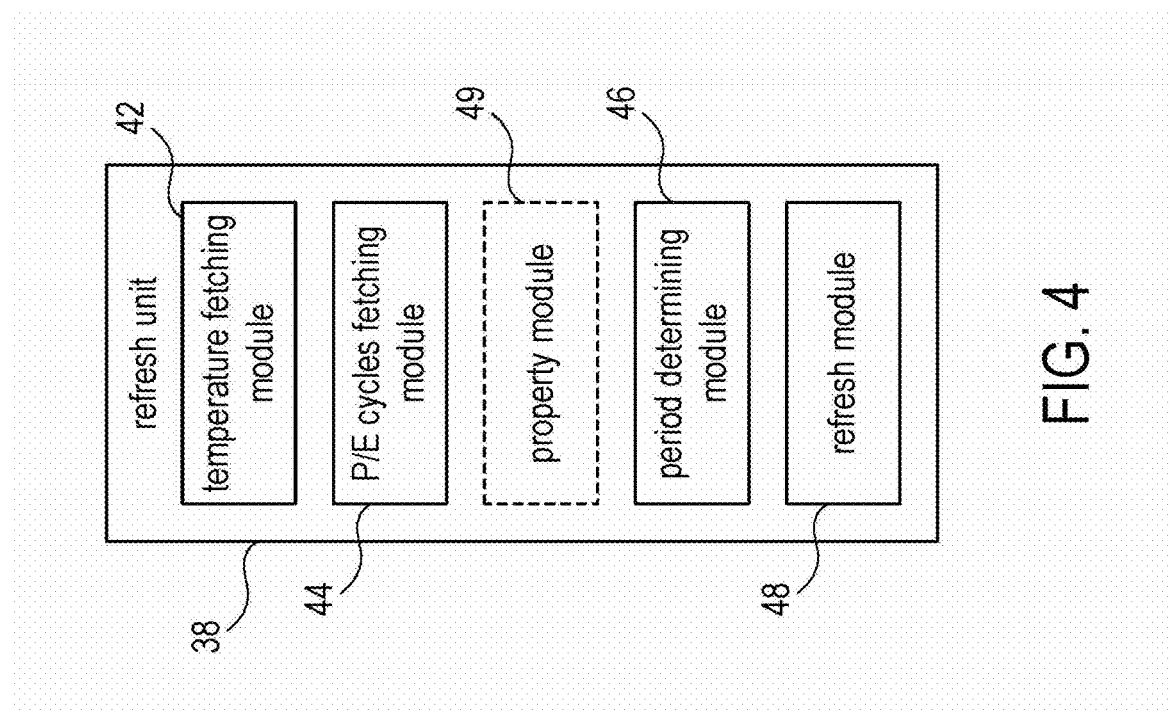
FIG. 4 is a schematic diagram showing a refresh unit in accordance with one embodiment of the present invention.

Referring to FIG. 3 and FIG. 4, there are shown schematic diagrams of a flash memory device and a refresh unit in accordance with one embodiment of the present invention. As shown in the figure, the flash memory device 30 of the present invention comprises a flash memory 32, a controller 36 and a sensor 34. The flash memory 32 comprises a plurality of memory blocks 321, wherein a portion of the plurality of memory blocks 321 are configured to be a data storage region 323 for storing data. The sensor 34 is configured to detect the temperature of the flash memory device 30. The controller 36 is connected to the flash memory 32 and the sensor 34 respectively for controlling the operation and data access of the flash memory 32.

The controller 36 comprises a refresh unit 38 configured to refresh all the memory blocks 321 of the data storage region 323. The refresh unit 38 comprises: a temperature fetching module 42, a P/E cycle fetching module 44, a period determining module 46 and a refresh module 48. The temperature fetching module 42 is configured to fetch the temperature detected by the sensor 34. The P/E cycle fetching module 44 is configured to fetch the number of P/E cycles of the flash memory 32. The period determining module 46 is configured to determine a safe period according to the temperature and the number of P/E cycles. The refresh module 48 is configured to refresh all the memory blocks 321 of the data storage region 323 during the safe period. The safe period is determined by the aforementioned method and will not be discussed here.

In one embodiment of the present invention, the flash memory 32 further comprises a reserve region 325 having the other portion of the plurality of memory blocks 321 for the operation of the flash memory device 30. In the present embodiment, the refresh module 48 refreshes all the memory blocks 321 of the data storage region 323 by:

copying the data of at least one memory block 321 of the data storage region 323 into the reserve region 325; erasing the at least one memory block 321; and rewriting the data into the at least one memory block 321. Since the data of the memory block 321 has been erased and rewritten, the period of data retention is also refreshed. Consequently, the period of data retention of the flash memory device 30 is greatly extended, and the data stored in the flash memory device 30 are prevented from bit error caused by exceeding the period of data retention.

In one embodiment of the present invention, the refresh unit 38 further comprises a property module 49 configured to store the properties of the flash memory 32, such as the relationship between the data retention and P/E cycles shown in FIG. 5, activation energy, or the relationship between the data retention and temperature. In the present embodiment, the period determining module 46 accesses the property module 49 according to the temperature and the P/E cycles of the flash memory 32 to obtain the period of data retention and calculate the safe period.

In one embodiment of the present invention, the refresh unit 38 of the present invention can be embodied by hardware, software or firmware.

Some examples are described for purposes of illustration in the following. For multi-level cell (MLC) flash memory manufactured by 15 nm process, the activation energy Ea is 0.9 eV. According to equation eq1, when the temperature of the flash memory device 30 is 85° C., the acceleration factor AF is approximately 66.22. If the number of P/E cycles of the flash memory 32 is less than 100, the period of data retention is 10 years under normal temperature 40° C. (please refer to FIG. 5). If the temperature of the flash memory device 30 is 85° C., the period of data retention is shortened with acceleration factor AF of 66.22, that the period of data retention is 10/66.22 year and is approximately 1.8 months. If the number of P/E cycles of the flash memory 32 is greater than 3000, the period of data retention is 1 year under normal temperature 40° C. If the temperature of the flash memory device is 85° C., the period of data retention is approximately 132 hours.

For preventing data from bit error caused by exceeding the period of data retention and read disturb, the present invention provides a predetermined rate to calculate the safe period. For example, if the predetermined rate is 1/2, the safe period of a flash memory with the number of P/E cycles less than 100 under normal temperature is 5 years. It means that all the memory blocks 321 of the data storage region 323 will be refreshed during 5 years. The safe period of a flash memory with the number of P/E cycles greater than 3000 under normal temperature is 0.5 year. Similarly, the safe period of a flash memory with the number of P/E cycles less than 100 under temperature of 85° C. is 0.9 year and 66 hours for flash memory with the number of PIE cycles greater than 300 under temperature of 85° C.

For multi-level cell (MLC) flash memory manufactured by 19 nm process, the activation energy Ea is 0.6 eV. According to equation eq1, when the temperature of the flash memory device 30 is 40° C., 50° C., 60° C., 70° C., 80° C. or 85° C., the acceleration factor AF is 1, 3, 11, 35, 101 or 168 respectively. Considering the worst situation of the flash memory with the number of P/E cycles greater than 3000, the period of data retention is 1 year, 4 months, 33 days, 10 days, 3.6 days and 52 hours under the temperature of 40° C., 50° C., 60° C., 70° C., 80° C. and 85° C. respectively. If the predetermined rate is 1/2, the safe period is 0.5 year, 2 months, 16 days, 1.8 days and 26 hours respectively.

In one embodiment of the present invention, the safe period can be divided into a plurality of block periods according to the number of the memory blocks 321 of the data storage region 323. If the data storage region 323 of the flash memory 32 comprises 1024 memory blocks 321, the safe period can be divided into 1024 block periods. In this case, by refreshing each memory block 321 of the data storage region 323 during the block period, all the memory blocks 321 of the data storage region 323 can be refreshed during the safe period. Furthermore, the safe period can also be divided into 512 or 256 block periods, and 2 or 4 memory blocks 321 should be refreshed during the block period respectively.

Since the lifetime of the flash memory 32 is closely related to the number of P/E cycles, the increase of P/E cycles during a predetermined period (such as 1 year, 1 month or 1 day) should be taken into consideration. In one embodiment of the present invention, the block period is determined according to the increase of P/E cycles during a predetermined period. For example, assume that an increase of 26 P/E cycles during 1 year is considered, the block period of an MLC flash memory 32 manufactured by 19 nm process with the number of P/E cycles greater than 3000 under temperature of 50° C. is 20 minutes for data storage region 323 with 1024 memory blocks 321 and 10 minutes for data storage region 323 with 2048 memory blocks 321. By refreshing each memory block 321 during the block period, all memory blocks 321 of the data storage region 323 will be refreshed for 26 times during 1 year.

Assume that the increase of 1 P/E cycle during 1 day is considered, the block period of the same flash memory 32 under temperature of 85° C. is 85 seconds for data storage region 323 with 1024 memory blocks and 43 seconds for data storage region 323 with 2048 memory blocks.

By using the method or device of the present invention, each memory block of the data storage region is refreshed during the safe period. Consequently, the data stored in the flash memory device is prevented from bit error caused by exceeding the period of data retention and read disturb.

Although particular embodiments of the invention have been described in detail for purposes of illustration, various modifications and enhancements may be made without departing from the scope of the invention specified by the claims.

What is claimed is:

1. A method for extending a period of data retention of a flash memory device, wherein the flash memory device comprises a flash memory with a plurality of memory blocks, wherein a portion of the plurality of memory blocks are configured to be a data storage region, wherein the method comprises:
    obtaining a temperature and a number of program/erase (P/E) cycles of the flash memory device;
    determining a safe period according to the temperature and the number of P/E cycles;
    obtaining a number of the memory blocks of the data storage region;
    dividing the safe period into a plurality of block periods according to the number of the memory blocks of the data storage region; and
    refreshing each memory block of the data storage region during the block period.

2. The method as claimed in claim 1, wherein the step of refreshing all the memory blocks of the data storage region during the safe period comprises: copying data of at least one memory block of the data storage region; erasing the at least one memory block; and rewriting the data into the at least one memory block.

3. The method as claimed in claim 2, wherein the other portion of the plurality of memory blocks are configured to be a reserve region.

4. The method as claimed in claim 1, wherein the safe period is equal to a period of data retention of the flash memory corresponding to the temperature and the number of P/E cycles multiplied by a predetermined rate.

5. The method as claimed in claim 4, wherein the predetermined rate is greater than 0 and smaller than 1.

6. The method as claimed in claim 1, wherein the step of refreshing the memory blocks of the data storage region is performed when the flash memory device is in an idle state.

7. A flash memory device for extending a period of data retention comprising:
- a flash memory having a plurality of memory blocks, wherein a portion of the plurality of memory blocks are configured to be a data storage region;
- a controller connected to the flash memory for controlling data access of the flash memory, wherein the controller has a refresh unit; and
- a sensor connected to the controller for detecting a temperature of the flash memory device;

wherein the refresh unit comprises:
- a temperature fetching module configured to obtain the temperature detected by the sensor;
- a program/erase (P/E) cycles fetching module configured to obtain a number of P/E cycles of the flash memory;
- a period determining module configured to determine a safe period according to the temperature and the number of P/E cycles, and obtain a number of the memory blocks of the data storage region, wherein the period determining module further divides the safe period into a plurality of block periods according to the number of the memory blocks of the data storage region; and
- a refresh module configured to refresh each memory block of the data storage region during the block period.

8. The device as claimed in claim 7, wherein the other portion of the plurality of memory blocks of the flash memory is configured to be a reserve region; wherein the refresh module refreshes the memory blocks by copying data of at least one memory block of the data storage region to the reserve region, erasing the at least one memory block and rewriting the data into the at least one memory block.

9. The device as claimed in claim 7, wherein the refresh unit further comprises a property module for storing properties of the flash memory.

10. The device as claimed in claim 7, wherein the refresh unit is embodied by hardware, software or firmware.

* * * * *